United States Patent [19]
Brodsky et al.

[11] Patent Number: 5,938,454
[45] Date of Patent: Aug. 17, 1999

[54] ELECTRICAL CONNECTOR ASSEMBLY FOR CONNECTING FIRST AND SECOND CIRCUITIZED SUBSTRATES

[75] Inventors: William Louis Brodsky, Binghamton; Glenn Lee Kehley, Endicott, both of N.Y.; Glenn Edward Myrto, Holly Springs, N.C.; John Henry Sherman, Lisle, N.Y.

[73] Assignee: International Business Machines Corporation, Armonk, N.Y.

[21] Appl. No.: 08/866,102

[22] Filed: May 30, 1997

[51] Int. Cl.[6] ....................................................... H01R 9/09
[52] U.S. Cl. ............................................. 439/71; 439/331
[58] Field of Search .................................. 439/71, 73, 331

[56] References Cited

U.S. PATENT DOCUMENTS

| | | | |
|---|---|---|---|
| 4,063,791 | 12/1977 | Cutchaw | 439/71 |
| 4,597,617 | 7/1986 | Enochs | 439/331 |
| 4,832,612 | 5/1989 | Grabbe et al. | 439/71 |
| 5,059,129 | 10/1991 | Brodsky et al. | 439/67 |
| 5,068,601 | 11/1991 | Parmenter | 439/331 |
| 5,137,461 | 8/1992 | Bindra et al. | 439/74 |
| 5,185,073 | 2/1993 | Bindra et al. | 439/91 |
| 5,321,583 | 6/1994 | McMahon | 205/104 |
| 5,468,158 | 11/1995 | Roebuck et al. | 439/73 |
| 5,691,041 | 11/1997 | Frankeny et al. | 439/71 |
| 5,793,618 | 8/1998 | Chan et al. | 439/331 |

*Primary Examiner*—Neil Abrams
*Assistant Examiner*—T C Patel
*Attorney, Agent, or Firm*—Lawrence R. Fraley

[57] ABSTRACT

An electrical connector for coupling two circuitized substrates (e.g., a ball grid array module and a printed circuit board) wherein the connector includes a base member fixedly secured (e.g., soldered) to the printed circuit board and having one substrate oriented therein. The connector further includes a 2-part retention member including one part movably oriented in the base and a second part for directly engaging the retained substrate to cause it to move downwardly (and thus in a completely different direction than the direction of rotation of the movable one part within the base) to thereby provide effective connection between substrates. An interposer may be used if desired. An information handling system including a microprocessor and connector electrically coupled thereto is also disclosed.

32 Claims, 6 Drawing Sheets

ELECTRICAL CONNECTOR ASSEMBLY FOR CONNECTING FIRST AND SECOND CIRCUITIZED SUBSTRATES

TECHNICAL FIELD

The invention relates to electrical assemblies and particularly to such assemblies wherein at least two circuits are electrically connected. Even more particularly, the invention relates to such assemblies wherein one circuitized substrate member is mounted onto a second circuitized substrate and electrically coupled thereto. The invention particularly relates to such assemblies usable in information handling systems (e.g., computers).

BACKGROUND OF THE INVENTION

Utilization of electrical connector assemblies for the purpose of electrically coupling various circuitized devices is, of course, known, with several examples being shown and described in the following patents:

U.S. Pat. No. 5,068,601—R. D. Parmenter
U.S. Pat. No. 5,059,129—W. L. Brodsky, et. al.
U.S. Pat. No. 5,321,583—J. F. McMahon In the design of electrical connectors adapted for connecting electrical devices such as ball grid array modules to a printed circuit board, multiple constraints need to be considered. Of the constraints to be considered are: (1) contact normal force; (2) material compatibility; (3) cleanliness of surfaces; (4) mechanical stability of the connector components, etc. An additional constraint when an electrical connector is to be used in an electrical assembly is circuit path disruption caused by mounting hardware used to hold the electrical connector in place. Holes through a printed circuit board as shown in FIG. 1 of U.S. Pat. No. 5,068,601 accommodate large and small guide pins shown in the load board. These holes extend through the load board, thereby restricting wiring paths that could be used to wire connection sites of a component to other components by the electrical circuits normal contained within the printed circuit board. As will be defined hereinbelow, the connector assembly of the invention provides a sound, reliable connection without the restriction of providing holes within or similar deformation of the circuitized member the connector assembly is mounted on.

DISCLOSURE OF THE INVENTION

It is a primary object of the invention to enhance the art of electrical connector assemblies.

It is another object of the invention to provide an electrical connector assembly which provides sound effective contact pressure between two different substrates in a reliable manner.

It is yet another object of the invention to provide such a connector assembly which does not require utilization of the internal area within either circuitized substrate such that said areas can include electrical circuitry, thereby allowing increased circuit densities for the substrates being successfully coupled.

It is a still further object of the invention to provide a connector assembly described herein that among other considerations can be produced in relatively large volumes, therein reducing the cost of individual assemblies.

It is yet another object of the invention to provide an enhanced information handling system which includes at least one (and preferably several) microprocessors electrically coupled using an electrical connector assembly as taught herein.

These and other objects are achieved according to one aspect of the invention through the provision of an electrical connector assembly for interconnecting a first circuitized substrate to a second circuitized substrate comprising a base member fixedly secured to the first circuitized substrate and adapted for having the second circuitized substrate positioned in a first orientation relative to the base member. A movable retention means movably positioned on the base member includes a first portion adapted for engaging the second circuitized substrate. A second portion of the retention means is adapted for engaging both the first portion and said base member, this second portion being movable with respect to both the base member and the first portion in a first direction from a first open position to a second closed position. Completing an electrical connection between said first and second circuitized substrates is accomplished during this motion. Both first and second portions of the movable retention means simultaneously move in a second direction different from the first direction when the second portion moves from the open position to the second closed position. A method for making such an electrical connector assembly is also disclosed herein.

In accordance with another aspect of the invention, there is provided an information handling system comprising a microprocessor and further including an electrical connector assembly for interconnecting a first circuitized substrate to a second circuitized substrate. This electrical connector assembly includes a base member fixedly secured to the first circuitized substrate (e.g., a printed circuit board or card) and adapted for having the second circuitized substrate (e.g., a tape ball grid array package having conductive apertures therein) positioned in a first orientation relative to the base member. A movable retention means is movably positioned on the base member, and includes a first portion adapted for engaging the second circuitized substrate and a second portion adapted for engaging both the first portion and the base member. The movable retention means is movable with respect to both the base member and the first portion in a first direction from a first open position to a second closed position. An electrical connection between the first and second circuitized substrates is completed while the first and second portions of the movable retention means substantially move simultaneously in a second direction different from the first direction of the second portion moving from the first open position to the second closed position.

BEST MODE FOR CARRYING OUT THE INVENTION

For a better understanding of the invention, together with other objects, advantages and capabilities thereof, reference is made to the following disclosure in connection with the aforementioned drawings.

In the development of an electrical connector for an electronic packaging application, the stability of the electrical contacts is of primary importance. Other significant influences includes ease of use, ease of manufacture, reliability, wearability, cooling impacts, etc. Reliability of the electrical connections determine the life expectancy of the electrical packaging system. Connector influence on the product functionality can in turn impact costs, size of packages, and the complexity of components used in the electronic package. Cooling factors can influence the size of the package, its operating temperature, and ultimately the reliability of the product being packaged. In the present invention, an electrical connector will be described that advances the state of art for surface mounted electrical connectors.

Figure 1:
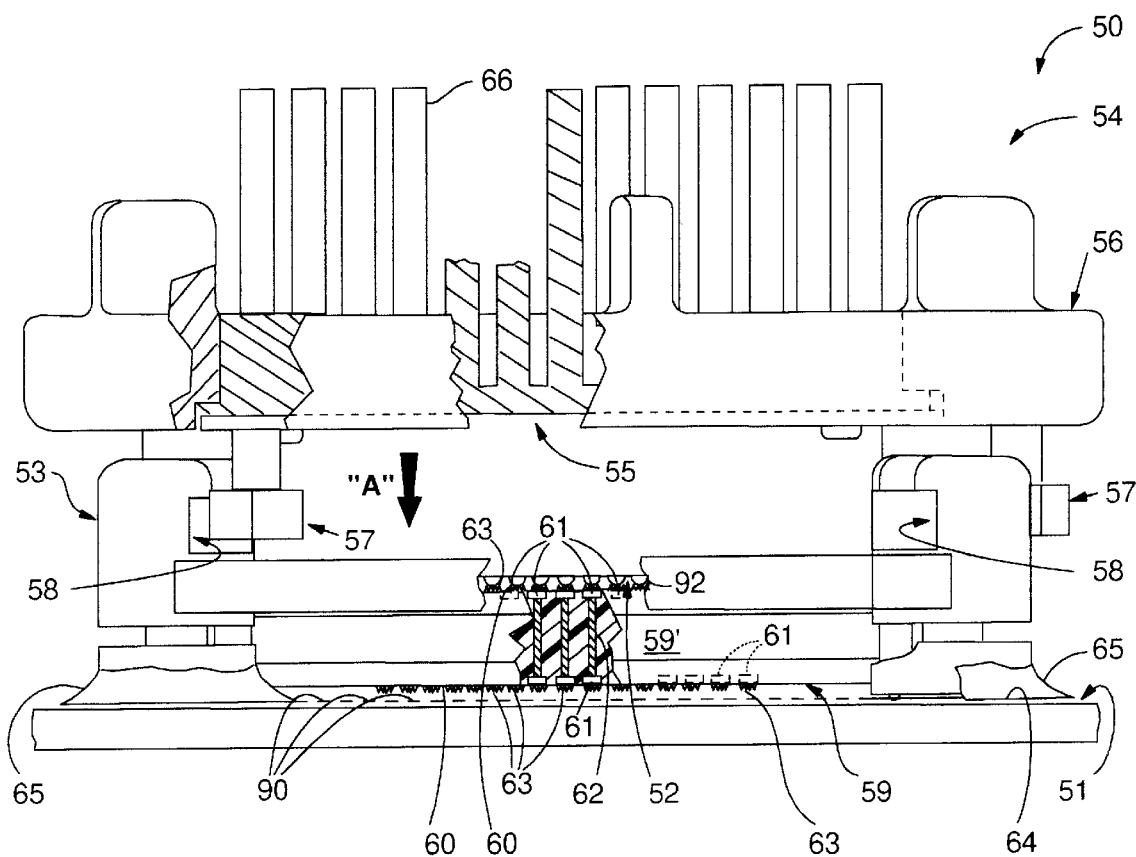
FIG. 1 is a side elevational view, partly in section, of an electrical connector assembly in a first open position prior to complete actuation thereof.

In FIG. 1 is shown an electrical connector 50 in accordance with a preferred embodiment of this invention. Connector 50 is adapted to make electrical connections between a first circuitized substrate 51 (e.g., a printed circuit card or board) and a second circuitized substrate 52 (e.g., an electronic module having an insulative body and a plurality of conductors 60 on a bottom surface thereof). Connector 50 comprises a base member 53 adapted for being fixedly secured (e.g., soldered) to the first circuitized substrate 51. Base member 53 is adapted for having the second circuitized substrate 52 positioned substantially therein and provides alignment of the second substrate to the first substrate. Base 53 is preferably of copper or copper alloy, but may also be of stainless steel. As clearly seen in FIG. 1, base member 53 is positioned only on one side of first substrate 51 and does not extend through the first substrate.

Figure 2:
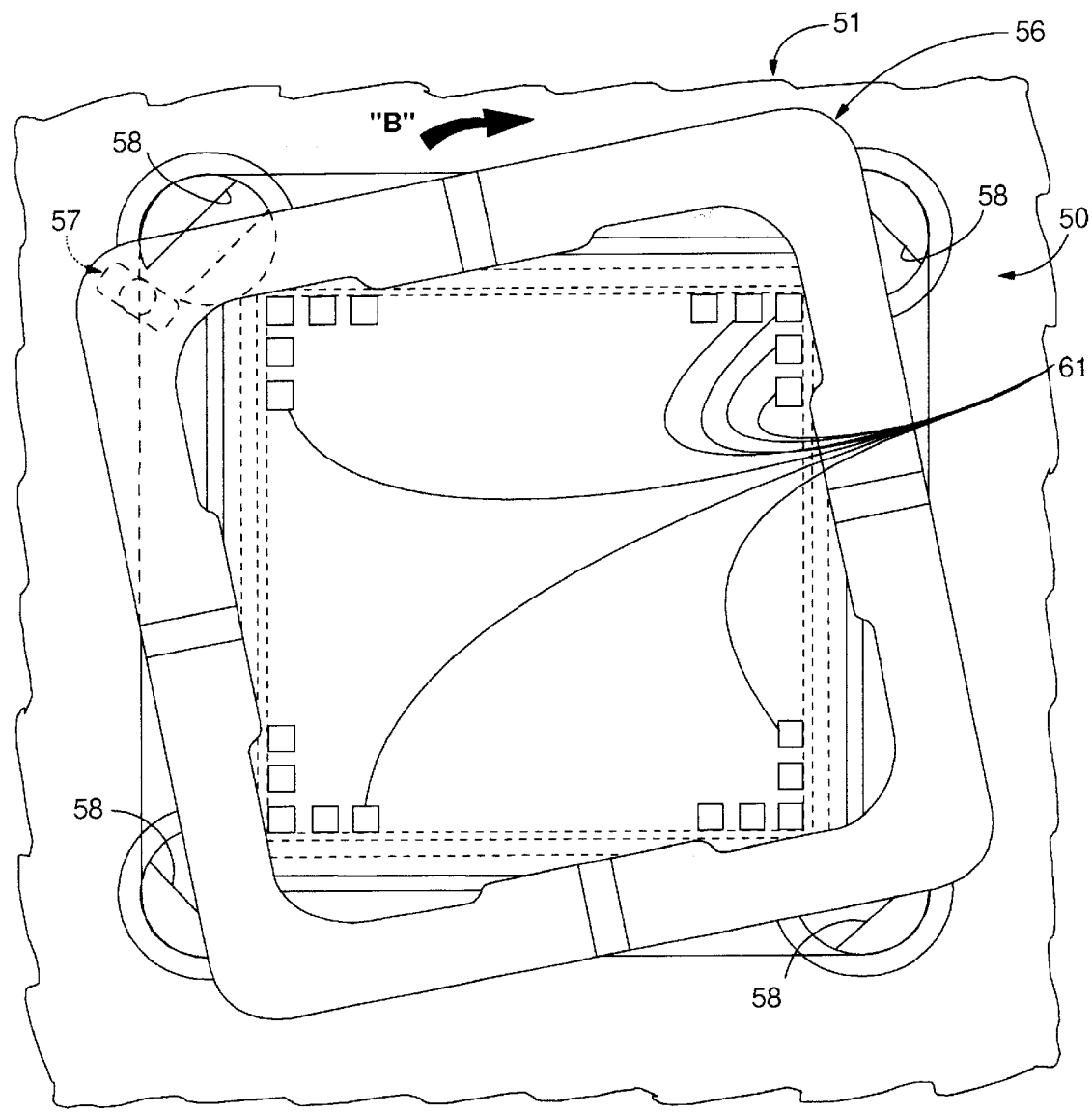
FIG. 2 is a top plan view of the electrical connector assembly of FIG. 1 in a first open position prior to actuation.
Figure 3:
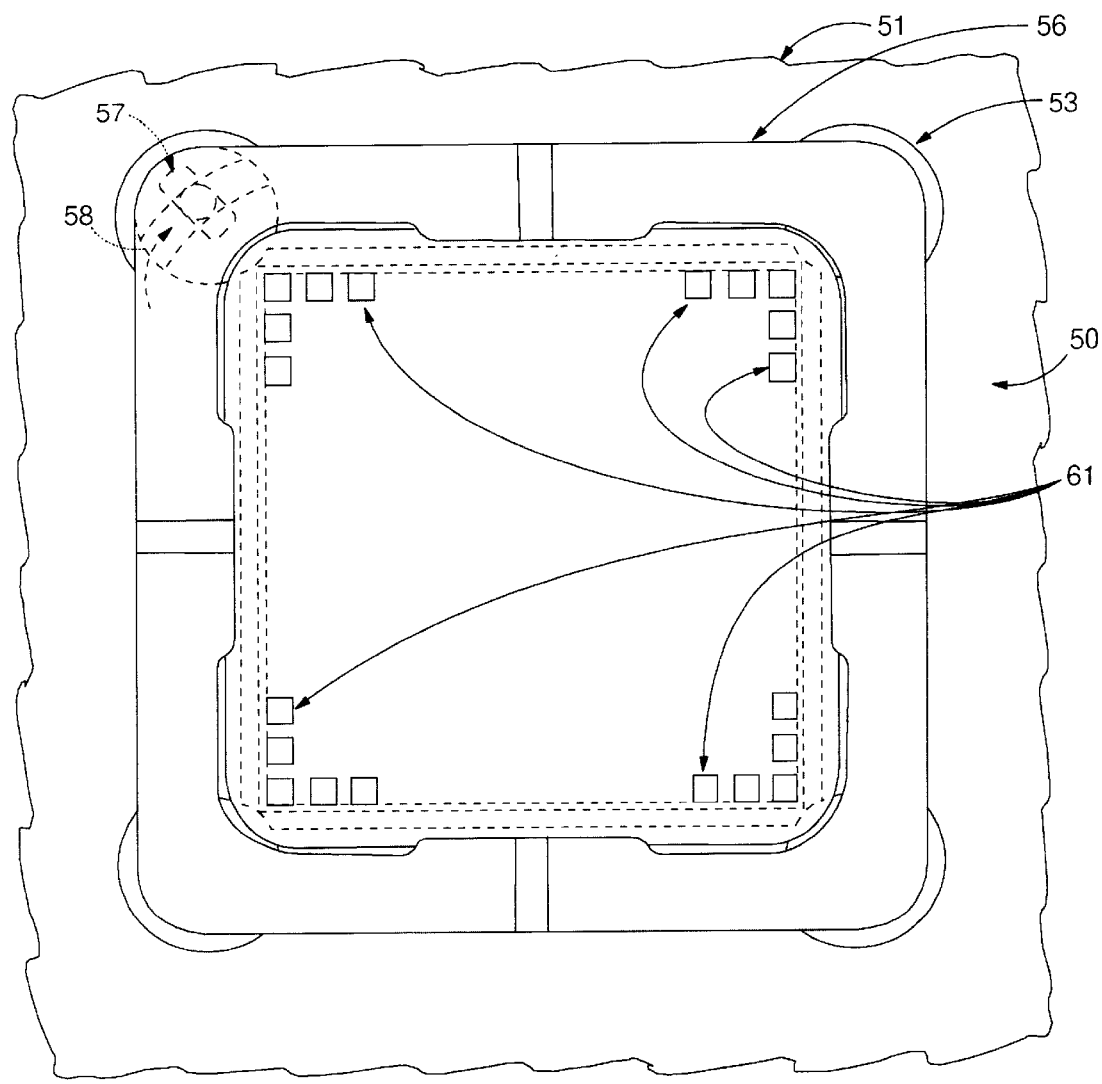
FIG. 3 is a top plan view of the electrical connector assembly of FIGS. 1 and 2 in a second, closed position following actuation.

A retention means 54 is movably positioned on base member 53 and is comprised of two portions. A first portion 55 is adapted for directly engaging second circuitized substrate 52 while a second portion 56 (shown in the open position in FIG. 1) is adapted, significantly, for engaging both the first portion 55 and base member 53. Both portions 55 and 56 are also preferably of stainless steel. Rotation of second portion 56 causes lugs 57 thereof (see also FIGS. 2 and 3) to engage the slots 58 in base 53. Preferably, four lugs (one at each corner of the rectangular shaped second portion 56) are used, for respectively engaging (compare FIGS. 2 and 3) four slots 58, also each at a respective corner of the also rectangular shaped base member 53. Only one lug and one slot are shown in FIGS. 2 and 3, it being understood that three more are used. The slots 58 each represent a cam surface such that when second portion 56 is rotated (direction "B" in FIG. 2) from the open position (shown in FIG. 2) to the closed position (shown in FIG. 3), the second portion 56 and the second substrate 52 both move in a downward direction ("A" in FIG. 1) substantially perpendicular to the rotational movement "B" causing the second substrate to electrically connect first substrate 51. Positioned between the first and second circuitized substrates is an optional interposer member 59 which may serve to enhance the electrical connection between the first and second circuitized substrates. Interposer 59 preferably includes a dielectric body 59' having a thickness in the range of approximately 0.001 to about 0.060 inch and further includes a plurality of interconnected electrical connection sites 61 located on two opposite surfaces of body 59'. The interposer's dielectric material may be a polyimide, epoxy/glass composite, or other suitable polymeric material. Preferably, connection sites 61 are conductive lands and are connected by conductive members 62 (e.g., plated through-holes) located within body 59'. Plated through-holes are known conductive structures, one example described in U.S. Pat. No. 5,059,129. Preferably, plated through-holes 62 have a drilled diameter in the range of approximately 0.004 to 0.025 inches and having a copper plating on the drilled walls of body 60 in the range of approximately 0.0005 to 0.0014 inches. Each of the opposed conductive lands 61 (some shown hidden in FIG. 1) may be plated with dendritic structures 63, such as described in U.S. Pat. Nos. 5,137,461 and 5,185,073. Such dendritic structures enhance electrical connections between the first and second circuitized members and interposer 59. As mentioned in these patents, the dendritic structures may be made of palladium, nickel or alloys thereof. These patents, and the others cited hereinabove, are incorporated herein by reference.

As stated, first circuitized substrate 51 may be a known printed circuit board, or, alternatively, an also known ceramic substrate. Either structure will include at least one (preferably four) large metallic pads 64 adapted for having base member 53 positioned thereon and secured thereto. The base is fixedly attached to pad(s) 64 of the first circuitized substrate with a joining material 65 (see especially FIG. 6). Joining material 65 may be an adhesive or a metallic interface material such as solder, depending on the materials and processes used. On the upper surface of first substrate 51 are the plurality of metallic pads 90 (see especially FIGS. 5 and 6) provided to make electrical connection to respective ones of the conductors 92 of second circuitized substrate 52 or, if used, those of interposer member 59, shown as dendritic members 63. If flat metallic pads (e.g., lands) are only used, with no dendrite members, these metallic pads may be coated with additional metallurgies to enhance the electrical connection. Examples of such coatings that may be used are SnPb, Pd, PdNi, Au or Ag.

Second circuitized substrate 52 may comprise a single or multiple semiconductor module, including one having a ceramic or polymeric substrate with a pattern of conductors (e.g., 92). Substrate 52 may also comprise a tape ball grid array with stiffener as defined in U.S. Pat. No. 5,519,936. If such a structure, the connecting sites 92 are preferably solder balls or similar elements. The second circuitized substrate has these electrical connecting sites 92 located on a surface thereof and positioned to make electrical connection with the respective first circuitized substrate or interposer member conductors.

Figure 6:
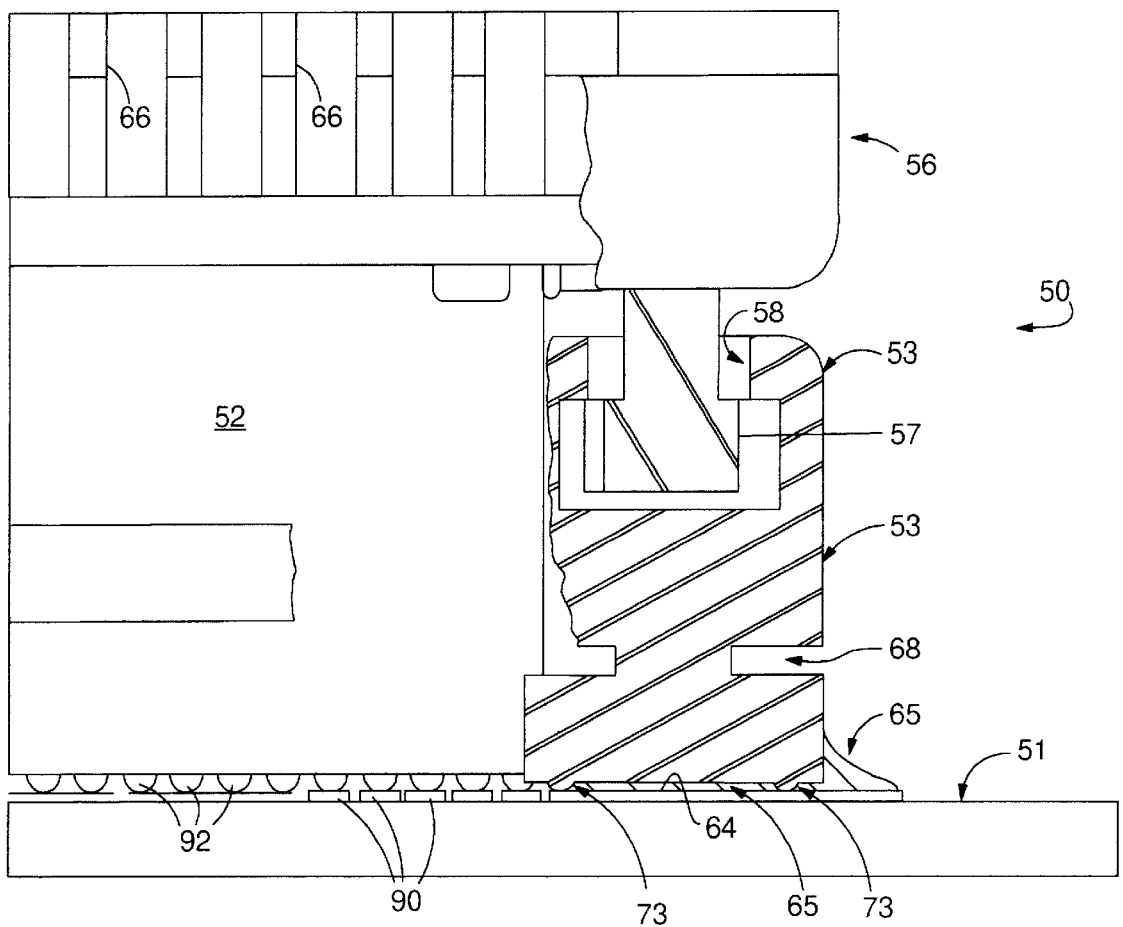
FIG. 6 is a much enlarged, sectional view of part of the invention's base member showing attachment thereof to the first substrate with at least one metallic pad.

FIG. 6 shows the electrical connecting sites 92 of second circuitized substrate 52 positioned directly on the metallic pads 90 of first substrate 51, without the use of an interposer member 59. Either pads 90 or sites 92 may have additional metallurgies such as dendrites to enhance this electrical connection.

The first portion 55 of movable retention means 54 may be further adapted to also provide cooling of the second circuitized substrate by enhancing the heat transfer from the operating substrate to an appropriate cooling medium (including the ambient air surrounding the invention). Portion 55 can include several upstanding cooling fins 66 (FIG. 1) or may form a closed member 67 (FIG. 4) having fluid passages 68 therein adapted for having both liquid (e.g., water) or mixed phase coolants pass therethrough. A pump (not shown) may be operatively coupled to member 67 to provide such circulation, while a fan may also be used to direct moving gas (e.g., air) across and through fins 66.

FIG. 2 is a top view of electrical connector 50 in the open position and FIG. 3 is the same view, but in the closed (actuated) position. First portion 55 of movable retention means 54 and the second circuitized substrate 52 are illustrated in partial, partly cross-sectional format in FIG. 1 to allow some of the electrical connection sites 63 to be visible. (See also FIG. 5.) As shown, the electrical connection sites are positionally located before the second portion 56 of retention means 54 is moved to the closed position (FIG. 3), thereby substantially eliminating movement (wiping) of the relatively delicate dendritic conductors 63 after initial connection between these conductors and the respective conductive sites 90 (and 92, if used). Minimizing motion of these electrical connections also allows the connections to be positioned in a closely spaced (tight) pattern, a significant feature of this invention.

Figure 4:
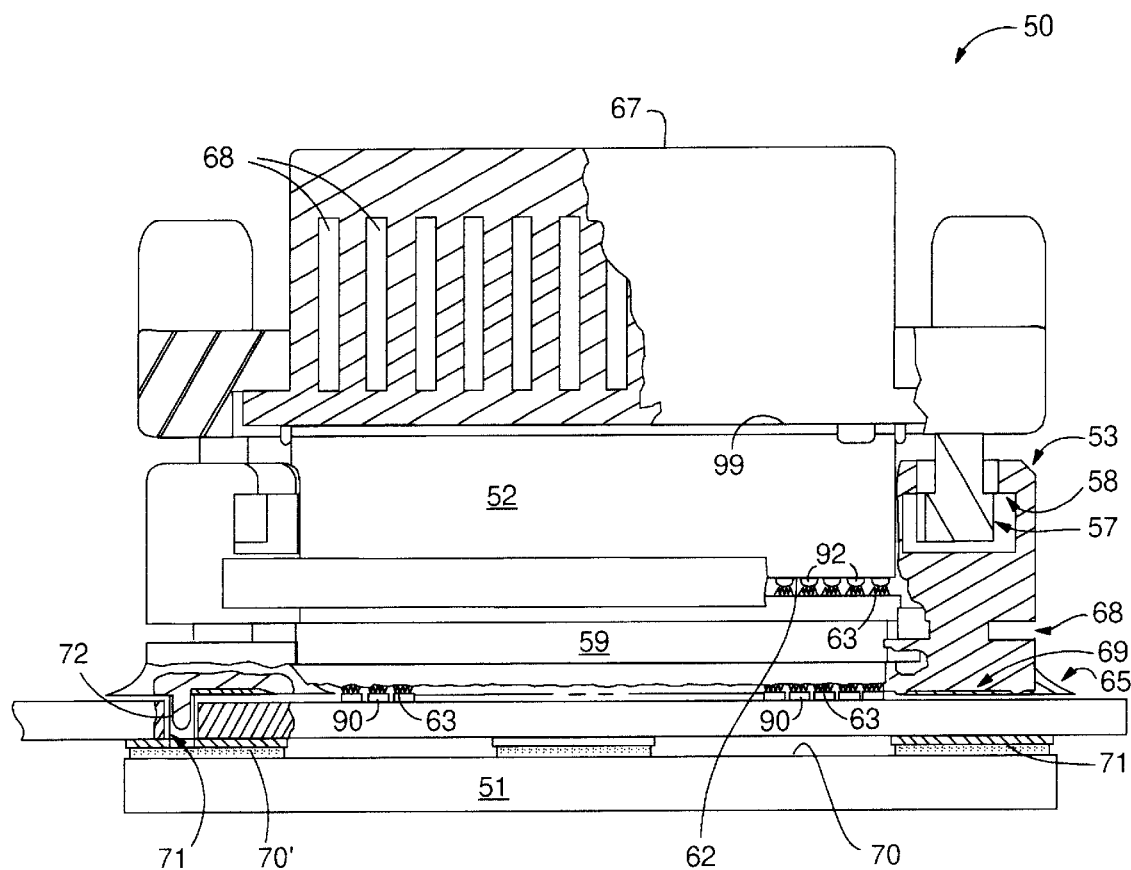
FIG. 4 is a side elevational view of an electrical connector assembly of a second embodiment of the invention in a second, closed position, actuation having occurred.

FIG. 4 shows electrical connector 50 in the closed position of FIG. 3, but with closed member 67 contacting the top surface 99 of second circuitized substrate 52. One of the cam slots 58 is shown in cross-section with lug 57 located therein. See also FIGS. 2 and 3. Base 53 has a thermal break groove 68 located therein to reduce the effective thermal mass of the base during solder attachment of base 53 to metallic pads 64 on the first circuitized substrate 51. The electrical connector is thus mounted to one, upper planar surface of first circuitized substrate 51. In FIG. 4, an optional stiffener member 70 is also shown. This stiffener member, preferably of stainless steel, can flatten and provide resistance to deflection for (thereby rendering more rigid) first circuitized member 51 when a pressure is exerted by the electrical connector perpendicular to substrate 51's upper surface. In this figure, stiffener 70 is attached to a second set of metallic pads 70 on the surface of the first circuitized substrate 51. The attachment material may be an adhesive or metallic interface material such as solder. In the case where pads 70' are eliminated, the stiffener may be bonded directly to the first circuitized substrate (e.g., with adhesive).

In FIG. 4, an alignment hole 71 is provided to accommodate an alignment pin 72 on the base member. This pin and hole alignment system may be used to facilitate locating of electrical connector 50 on first circuitized substrate 51. This pin and hole alignment system would be positioned to minimize impact on electrical signal paths and to prevent undesired use of substrate real estate.

Figure 5:
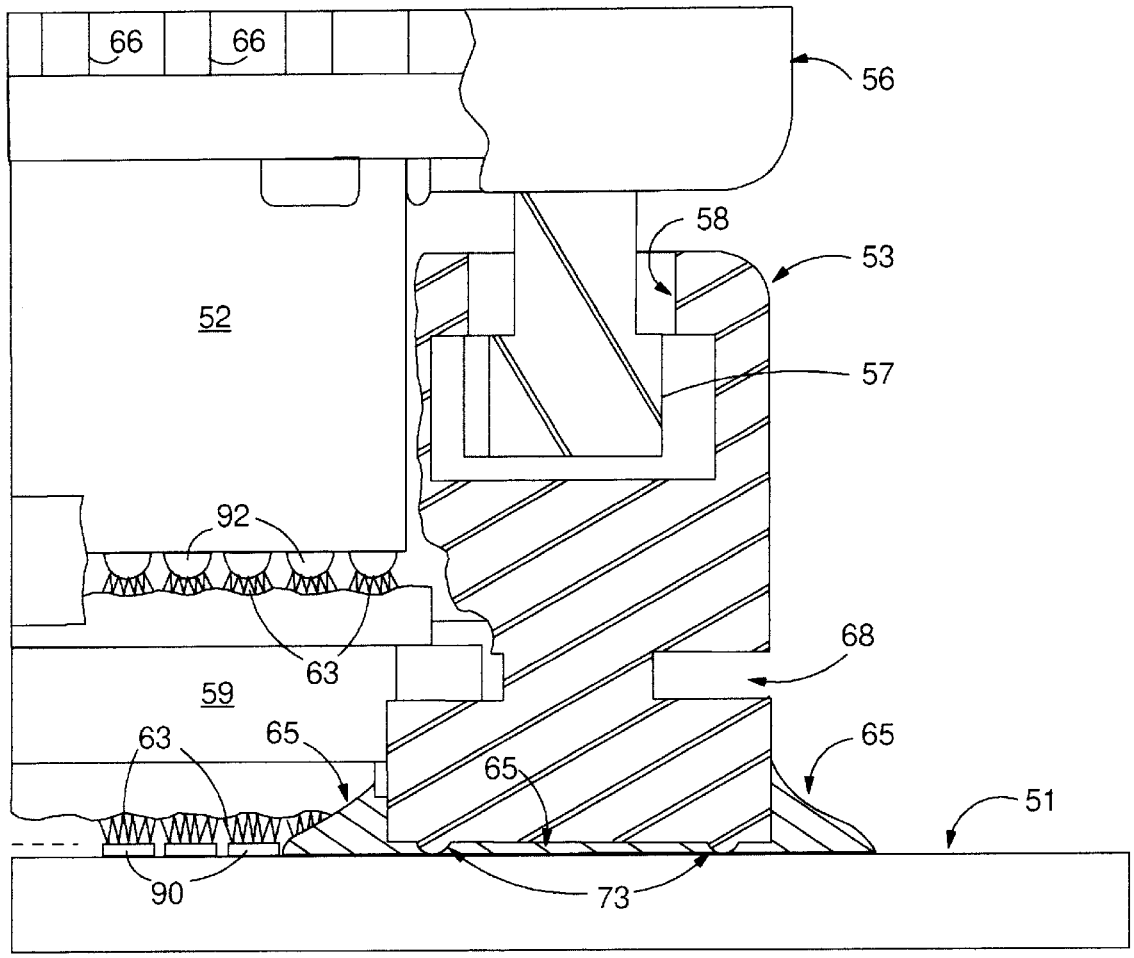
FIG. 5 is a much enlarged, sectional view of part of the invention's base member and attachment thereof to a first circuitized substrate.

FIG. 5 is an enlargement of the base member 53 to first circuitized substrate 51 connections 90. Base member 53 is directly positioned on the upper surface of the first circuitized substrate 51 and joined with an adhesive or solder 65. Base member 53 may include standoffs 73 to provide a minimum spacing between the base's lowermost surfaces and the upper surface of substrate 51, thereby also determining the proper adhesive thickness. (These standoffs can also be used when a metallic interface material such as solder is used.) Alternatively, a mounting arrangement (not shown but readily understandable) that clamps the base member to the stiffener member could be provided to eliminate the joint between the base and circuitized member.

The electrical connector 50 as described can be used for various electronic packaging applications including computers and other consumer electronics. If connector 50 is to form part of an information handling system, one or both of the circuitized substrates defined herein may include one or more microprocessors (not shown) as part thereof. Such microprocessors (semiconductor chips) are in widespread usage and further description should not be necessary. In one embodiment of the invention, the second circuitized substrate would include at least one semiconductor chip electrically coupled to respective substrate circuitry. Attention is again directed to U.S. Pat. No. 5,519,936 where such a structure is shown in greater detail. It is also understood that substrates 51 and 52 as defined herein can be directly electrically coupled to nearby microprocessors (not shown) or have these positioned thereon.

While there have been shown and described what are at present the preferred embodiments of the invention, it will be obvious to those skilled in the art that various changes and modifications may be made therein without departing from the scope of the invention as defined by the appended claims.

What is claimed is:

1. An electrical connector assembly for interconnecting a first circuitized substrate to a second circuitized substrate comprising:

a base member adapted for being fixedly secured to a first upper surface of said first circuitized substrate and not extending through said first circuitized substrate, said base member adapted for having said second circuitized substrate positioned in a first orientation relative to said base member and for aligning said second substrate relative to said first substrate; and a movable retention means movably positioned on said base member and including a first portion adapted for engaging said second circuitized substrate and a second portion adapted for engaging said first portion and said base member and being movable with respect to both said base member and said first portion in a first direction to occupy a first open position and a second closed position with respect thereto to complete an electrical connection between said first and second circuitized substrates, both said first and second portions of said movable retention means substantially simultaneously moving in a second direction different from said first direction when said second portion moves from said first open position to said second closed position.

2. The electrical connector assembly according to claim 1 further including an interposer positioned between said first and second circuitized substrates, said interposer comprising a dielectric material having first and second surfaces and including a plurality of electrically conductive members located within said dielectric material substantially between said first and second surfaces of said dielectric material for being electrically coupled to said first and second circuitized substrates.

3. The electrical connector assembly according to claim 2 wherein said electrically conductive members of said interposer include dendritic structures to provide said electrical coupling between said first and second circuitized substrates.

4. The electrical connector assembly according to claim 3 wherein said dendritic structures are comprised of a material selected from the group consisting of palladium, nickel and alloys thereof.

5. The electrical connector assembly according to claim 2 wherein selected ones of said electrically conductive members each comprise a conductive through-hole element.

6. The electrical connector assembly according to claim 5 wherein said conductive through-hole element further includes first and second conductive land portions positioned substantially on said first and second surfaces, respectively, of said dielectric material of said interposer.

7. The electrical connector assembly according to claim 2 wherein said dielectric material comprises polyimide.

8. The electrical connector assembly according to claim 2 wherein said dielectric material comprises glass-reinforced epoxy resin.

9. The electrical connector assembly according to claim 1 wherein said first portion of said movable retention means comprises a thermal conductor adapted for cooling said second circuitized substrate.

10. The electrical connector assembly according to claim 9 wherein said thermal conductor is a fluid cooled heatsink.

11. The electrical connector assembly according to claim 9 wherein said thermal conductor is a cold plate adapted for being cooled by the passage of fluid therethrough.

12. The electrical connector assembly according to claim 1 wherein said base member includes a plurality of channels therein, said second portion of said movable retention means including projections adapted for engaging corresponding ones of said channels in said base member, said projections movable within said channels during said movement of said second portion from said first open position to said second closed position.

13. The electrical connector assembly according to claim 1 wherein said base member is adapted for being fixedly secured to said first surface of said first circuitized substrate using an adhesive.

14. The electrical connector assembly according to claim 1 wherein said first circuitized substrate includes at least one metallic pad, said base member adapted for being fixedly secured to said at least one metallic pad.

15. The electrical connector assembly according to claim 14 wherein said base member is adapted for being fixedly secured to said at least one metallic pad using solder.

16. The electrical connector assembly according to claim 1 further including a stiffener member located on a second surface of said first circuitized substrate for supporting said first circuitized substrate in a relatively rigid manner.

17. The electrical connector assembly according to claim 16 wherein said stiffener member is securely fastened to said second surface of said first circuitized substrate.

18. The electrical connector assembly according to claim 17 wherein said stiffener member is securedly attached to said second surface of said first circuitized substrate using solder.

19. The electrical connector assembly according to claim 17 wherein said stiffener member is securedly attached to said second surface of said first circuitized substrate using adhesive.

20. An information handling system including a microprocessor and an electrical connector assembly coupled to said microprocessor, said electrical connector assembly comprising:

an electrical connector assembly for interconnecting a first circuitized substrate to a second circuitized substrate within said information handling system, said electrical connector assembly including a base member fixedly secured to a first upper surface of said first circuitized substrate and not extending through said first circuitized substrate, said base member adapted for having said second circuitized substrate positioned in a first orientation relative to said base member and for aligning said second substrate relative to said first substrate, and a movable retention means movably positioned on said base member and including a first portion for engaging said second circuitized substrate and a second portion adapted for engaging said first portion and said base member and being movable with respect to both said base member and said first portion in a first direction to occupy a first open position and a second closed position with respect thereto to complete an electrical connection between said first and second circuitized substrates, both first and second portions of said movable retention means substantially simultaneously moving in a second direction different from said first direction when said second portion moves from said first open position to said second closed position.

21. The information handling system according to claim 20 wherein each of said first and second circuitized substrates includes a plurality of electrically conductive pads, selected ones of said electrically conductive pads of said first circuitized substrate adapted for being electrically coupled to respective ones of said electrically conductive pads of said second circuitized substrate.

22. The information handling system according to claim 20 wherein said second circuitized substrate comprises an electronic module.

23. The information handling system according to claim 22 wherein said electronic module is electrically coupled to said first circuitized substrate using a plurality of solder members.

24. A method of making an electrical connector assembly for electrically interconnecting a first circuitized substrate to a second circuitized substrate, said method comprising the steps of:

providing a first circuitized substrate;

fixedly securing a base member to a first, upper surface of said first circuitized substrate without extending said base member through said first circuitized substrate;

providing a second circuitized substrate and positioning said second circuitized substrate in a first orientation relative to said base member, said base member aligning said second circuitized substrate relative to said first circuitized substrate;

movably positioning a retention means having first and second portions on said base member;

engaging said second circuitized substrate with said first portion of said retention means;

engaging both said first portion and said base member with said second portion of said retention means; and moving said second portion with respect to both said base member and said first portion in a first direction to occupy a first open position and a second closed position with respect thereto to complete an electrical connection between said first and second circuitized substrates, both said first and second portions of said movable retention means substantially simultaneously moving in a second direction different from said first direction when said second portion moves from said first open position to said second closed position.

25. The method of making an electrical connector assembly according to claim 24 further including:

positioning an interposer between and in contact with said first and second circuitized substrates, said interposer comprising a dielectric material having first and second surfaces and including a plurality of electrically conductive members located within said dielectric material substantially between said first and second surfaces of said dielectric materials, said conductive members adapted for being electrically coupled to said first and second circuitized substrates.

26. The electrical connector assembly according to claim 25 further including plating of electrically conductive dendritic structures on said electrically conductive members of said interposer prior to positioning said interposer between said first and second circuitized substrates.

27. The method of making an electrical connector assembly according to claim 25 further including providing plated through-holes in said interposer to form said selected ones of said electrically conductive members located within said dielectric material.

28. The method of making an electrical connector assembly according to claim 24 including providing a thermal conductor adapted for cooling said second circuitized substrate within said first portion of said movable retention means.

29. The method of making an electrical connector assembly according to claim 24 further including positioning an adhesive between said base member and said first circuitized substrate, said adhesive fixedly securing said base member to said first circuitized substrate.

30. The method of making an electrical connector assembly according to claim 24 further including providing at least one metallic pad on said first circuitized substrate and thereafter fixedly securing said base member to said at least one metallic pad.

31. The method of making an electrical connector assembly according to claim 30 further including positioning a metallic interface material between said base member and said first circuitized substrate to fixedly secure said base member to said at least one metallic pad on said first circuitized substrate.

32. The method of making an electrical connector assembly according to claim 24 further including positioning a stiffener member on a second surface of said first circuitized substrate for supporting said first circuitized substrate in a substantially rigid member.

* * * * *